(12) United States Patent
Sheffield et al.

(10) Patent No.: US 11,479,123 B2
(45) Date of Patent: Oct. 25, 2022

(54) VEHICLE MANAGEMENT SYSTEM AND REPLACEMENT OF SEPARATE POWER DISTRIBUTION UNITS

(71) Applicant: The Boeing Company, Chicago, IL (US)

(72) Inventors: Gregory Lloyd Sheffield, St. Louis, MO (US); Femando Dones, Thorton, PA (US); Joseph A. Schneider, Havertown, PA (US)

(73) Assignee: The Boeing Company, Chicago, IL (US)

( * ) Notice: Subject to any disclaimer, the term of this patent is extended or adjusted under 35 U.S.C. 154(b) by 171 days.

(21) Appl. No.: 16/389,075

(22) Filed: Apr. 19, 2019

(65) Prior Publication Data
US 2020/0331351 A1   Oct. 22, 2020

(51) Int. Cl.
*B60L 3/04* (2006.01)
*G01R 31/00* (2006.01)
*B60R 16/03* (2006.01)

(52) U.S. Cl.
CPC .............. *B60L 3/04* (2013.01); *B60R 16/03* (2013.01); *G01R 31/007* (2013.01)

(58) Field of Classification Search
CPC .. H02J 4/00; B64D 43/00; H02H 3/04; H02H 7/30; B60R 16/03; H03K 17/18; G01R 31/007
See application file for complete search history.

(56) References Cited

U.S. PATENT DOCUMENTS

| | | | | |
|---|---|---|---|---|
| 2004/0066595 | A1* | 4/2004 | Tignor | H02H 3/006 361/93.1 |
| 2006/0108873 | A1* | 5/2006 | Hamasaki | H02J 4/00 307/10.1 |
| 2009/0212975 | A1* | 8/2009 | Ausman | H03K 17/18 340/945 |
| 2010/0039741 | A1* | 2/2010 | Booth | H02H 1/0061 361/63 |
| 2012/0013177 | A1* | 1/2012 | Krenz | H02J 4/00 307/9.1 |

\* cited by examiner

*Primary Examiner* — Faris S Almatrahi
*Assistant Examiner* — Andrew J Cromer
(74) *Attorney, Agent, or Firm* — Yee & Associates, P.C.

(57) ABSTRACT

A vehicle management system (VMS) computer includes a power distribution controller that includes a plurality of power distribution circuits that are each controlled by the controller to supply power to end component loads. The power distribution controller is communicably coupled to a data processing system by a bus. The VMS computer also includes a plurality of settable circuit breakers, wherein each of the plurality of settable circuit breakers corresponds to a respective one of the plurality of power distribution circuits. The power distribution controller is configured to monitor various values such as voltages, currents, powers, power spikes, and interruptions and to interrupt a respective one of the plurality of power distribution circuits via a settable circuit breaker upon detecting an indication of a fault from the monitored values.

20 Claims, 7 Drawing Sheets

VEHICLE MANAGEMENT SYSTEM AND REPLACEMENT OF SEPARATE POWER DISTRIBUTION UNITS

CROSS-REFERENCE TO RELATED APPLICATIONS

This application is related to U.S. patent application Ser. No. 16/389,030, entitled "Integration of Vehicle Management System and Power Distribution Control" filed even date herewith, now U.S. Pat. No. 10,822,107, issued Nov. 3, 2020, the contents of which are incorporated herein by reference, and to U.S. patent application Ser. No. 16/389,112, entitled "Vehicle Management System and Parallel Power Distribution Lines" filed even date herewith, the contents of which are incorporated herein by reference.

BACKGROUND INFORMATION

1. Field

The present disclosure relates generally to electrical power distribution and, more specifically, to methods and a system for controlling electrical power distribution in vehicles.

2. Background

Modern aircraft make use of many electric devices including, for example, electric motors, electronic sensors, computers, lights, and electronic displays. Each of these devices has its own power requirements. Some require alternating current while others require direct current. Additionally, the voltage, current, and power levels of different components differ. In order to provide power to each device on the aircraft requiring power, power distribution controllers are utilized. However, current power distribution controllers suffer from a number of disadvantages that adversely impact the customization of power delivery, the ease of assembly, and the weight. Therefore, it would be desirable to have a power distribution system that improves upon existing systems and addresses these and other problems.

SUMMARY

In one illustrative embodiment, a vehicle management system (VMS) computer includes a data processing system having a processor and a memory. The VMS computer also includes a power distribution controller. The power distribution controller includes a plurality of power distribution circuits that are each controlled by the controller to supply power to end component loads. The power distribution controller communicably coupled to the data processing system by a bus. The VMS computer also includes a plurality of settable circuit breakers, wherein each of the plurality of settable circuit breakers corresponds to a respective one of the plurality of power distribution circuits. The power distribution controller is configured to monitor sensed voltage, sensed current levels, spikes in the internal power distribution circuits, and interruptions in the internal power distribution circuits. The power distribution controller is further configured to interrupt a respective one of the plurality of power distribution circuits via a settable circuit breaker upon detecting at least one of a sensed voltage level indicative of a fault, a sensed current level indicative of a fault, and a power level indicative of a fault.

In another illustrative embodiment, a method for selectively powering a plurality of end components in a vehicle includes monitoring each of a plurality of end component loads for a fault condition. The method also includes selectively interrupting power to a one of the plurality of end component loads in response to a determination that a fault occurred in the one of the plurality of end component loads. A selected power to each of remaining ones of the plurality of end component loads remains unaffected by the interruption of power to the one of the plurality of end component loads.

In yet another illustrative embodiment, a vehicle management system (VMS) for selectively interrupting power to an end component in a vehicle includes a processor and a non-transitory computer readable medium storing program code which, when executed by the processor, performs a computer-implemented method selective power interruption. The program code includes program code for monitoring each of a plurality of end component loads for a fault condition. The program code also includes program code for selectively interrupting power to a one of the plurality of end component loads in response to a determination that a fault occurred in the one of the plurality of end component loads, wherein a selected power to each of remaining ones of the plurality of end component loads remains unaffected by the interruption of power to the one of the plurality of end component loads.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Figure 1:
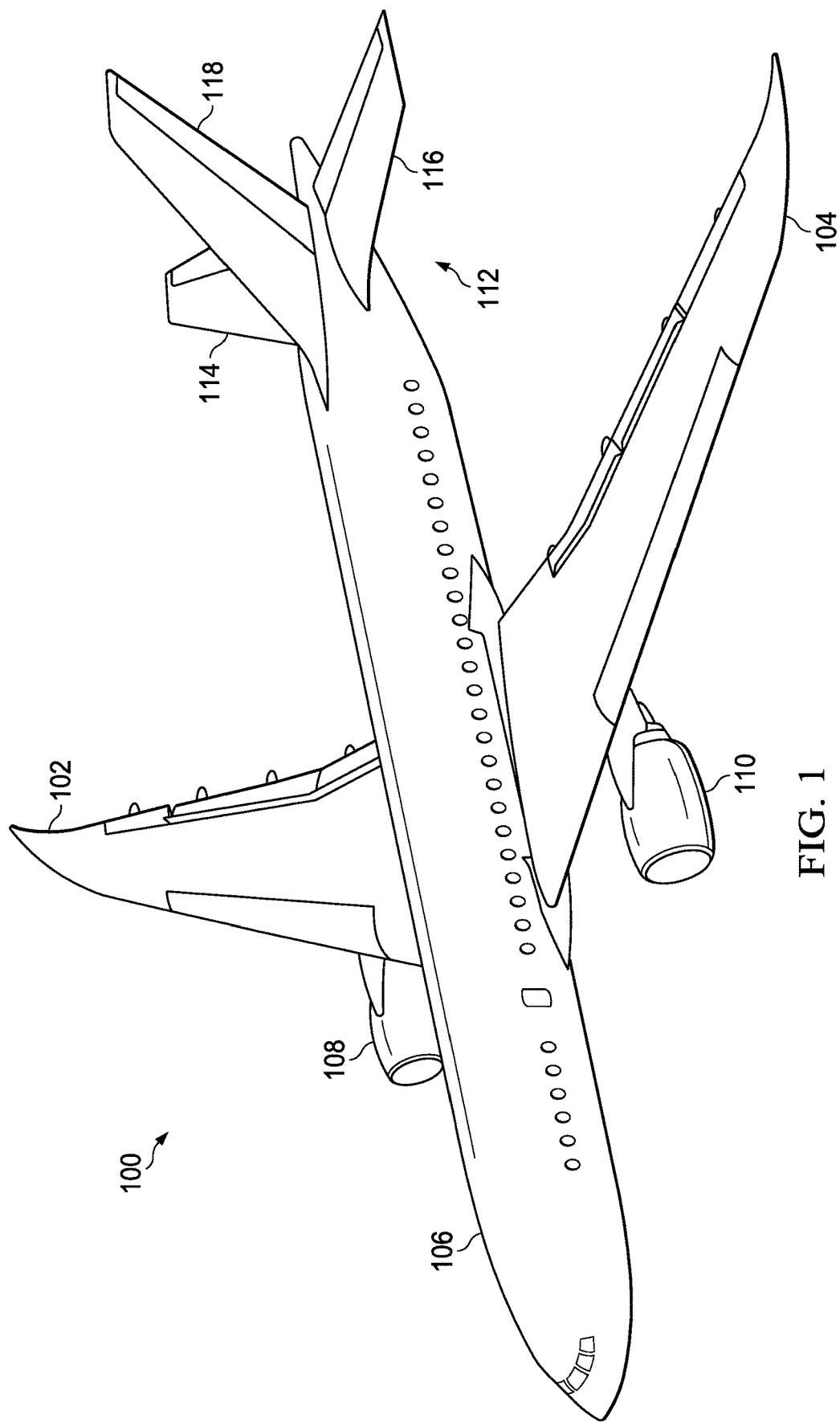
FIG. 1 is an illustration of an aircraft in which an illustrative embodiment may be implemented.

The different illustrative embodiments recognize and take into account one or more different considerations. For example, the illustrative embodiments recognize and take into account that existing aircraft power distribution techniques and power management schemes are inefficient. The illustrative embodiments recognize and take into account that existing power distribution with an aircraft use disparate power devices (e.g., circuit breakers, filters, rectifiers, etc.) for integrating critical elements (i.e., component, unit, subsystem, system, etc.) within a vehicle management system (VMS) architecture. For example, the illustrative embodiments recognize and take into account that existing power distribution systems allocate worst case power to each critical element with a viewpoint to all or none functionality. Additionally, the illustrative embodiments recognize and take into account that existing power distribution solutions require several dedicated power lines from a power circuit breaker panel or solid state distribution unit to multiple devices within a given system or subsystem using fixed voltage/current settings. Furthermore, the illustrative embodiments recognize and take into account that this practice limits the ability of integrator opportunities to optimize distributive power during varying operational conditions (e.g., startup, take-off, cruise, landing, etc.) or to support partial system/subsystem functionality.

Additionally, the illustrative embodiments recognize and take into account that providing power to an end component over two parallel power distribution lines where each can supply full power in the event of interruption in the other line extends the life of the parallel power distribution lines.

Additionally, the illustrative embodiments recognize and take into account that existing power distribution schemes within aircraft use disparate power devices (e.g., circuit breakers, filter, rectifiers, etc.) for integrating critical elements (e.g., component, unit, subsystem, system, etc.) within a vehicle management system (VMS) architecture and that the use of disparate power devices negatively impacts time-sensitive management of safety critical elements. Thus, in an illustrative embodiment, the power distribution controller is integrated with the VMS to improve time sensitivity in management of safety critical elements.

Additionally, the illustrative embodiments recognize and take into account that it is beneficial to monitor sensed voltage and current levels, spikes in power, and interruptions in power and interrupt an individual power distribution circuit vie a settable circuit breaker upon detecting a sensed voltage, current, or power level indicative of a fault and to shut down individual power distribution circuits without interrupting operation of the remaining plurality of power distribution circuits.

Embodiments of the disclosure provide integration of the power distribution functionality within the VMS computing infrastructure, thereby providing improved power management capabilities. Embodiments of the disclosure support dynamic reconfiguration within the entire system/subsystem during time-sensitive startup or shutdown, various flight phases, fault conditions, and other conditional states. Dynamic reconfiguration, among other benefits, supports extending the life of the overall system and platform. Embodiments of the present disclosure reduce wiring and installation weight associated with power distribution lines, support hierarchical power management and shedding techniques, allow for optimal dynamic power allocation during various operational conditions, and provide solutions for reducing power-up latency times for time-sensitive functions. Additionally, embodiments of the present disclosure extend the useful life of the systems and platforms, improve fault detection and isolation related to distributive power, extends flight duration of battery-dependent platforms, and reduces the number of disparate power components (e.g., rectifiers, transformers, breakers, etc.) to clean up and manage power.

Embodiments of the present disclosure provide substantially optimized power distribution and power management, especially for all electrical and battery dependent platforms. Embodiments of the present disclosure also provide means for flight safety critical systems to support time-sensitive startup, recovery, shutdown, and fault conditions. Embodiments of the present disclosure reduce non-recurring, recurring, and life cycle costs as compared to prior art power distribution schemes by providing a common filtered power distribution system. Additionally, embodiments of the present disclosure improve sustainment capabilities with increased fault detection and isolation, improve platform system reliability with the use of power shedding techniques for extending the life of systems, reduces installation weight with a lower wire/cable count and reduced wire/cable lengths, optimizes power during varying operational conditions, and reduces wiring manufacturing recurring and non-recurring costs.

Various embodiments of the present disclosure provide dedicated clean power source(s) to send components, dynamic reconfiguration of power distribution during power optimization flight phases, dynamic reconfiguration of the power distribution during fault conditions, dynamic reconfiguration to support extending the life of the overall system and platform, and provide sequential power enablement to support hierarchical time sensitive layers/paths. Additionally, various embodiments of the present disclosure provide for partial functionality to end components rather than simply all or none as provided for by prior art systems.

Some benefits provided by one or more embodiments of the present disclosure include reduced power distribution complexity, allowing for optimal dynamic power allocation during various operational conditions, reduce power-up latency times for time-sensitive functions, extends the useful life of systems and platforms, and improved fault detection and isolation related to distributive power.

In contrast to prior art power distribution systems, the illustrative embodiments provide consolidated power distribution within the VMS computing architecture. Furthermore, the illustrative embodiments provide clean distributed power within the VMS, provide for cross-channel power management and shedding communications, and provide for dynamic reconfigurable electronic circuit breakers.

Referring now to the figures and, in particular, with reference to FIG. 1, an illustration of an aircraft is depicted in which an illustrative embodiment may be implemented. In this illustrative example, aircraft 100 has wing 102 and wing 104 connected to body 106. Aircraft 100 includes engine 108 connected to wing 102 and engine 110 connected to wing 104.

Body 106 has tail section 112. Horizontal stabilizer 114, horizontal stabilizer 116, and vertical stabilizer 118 are connected to tail section 112 of body 106. Aircraft 100 is an example of an aircraft in which the disclosed enhanced autobrake system may be implemented.

As used herein, "a number of," when used with reference to items, means one or more items. For example, "a number of power distribution control units 218" is one or more different types of power distribution control units 218.

Further, the phrase "at least one of," when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item C. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

This illustration of aircraft 100 is provided for purposes of illustrating one environment in which the different illustrative embodiments may be implemented. The illustration of aircraft 100 in FIG. 1 is not meant to imply architectural limitations as to the manner in which different illustrative embodiments may be implemented. For example, aircraft 100 is shown as a commercial passenger aircraft. The different illustrative embodiments may be applied to other types of aircraft, such as a private passenger aircraft, a rotorcraft, or other suitable types of aircraft.

Figure 2:
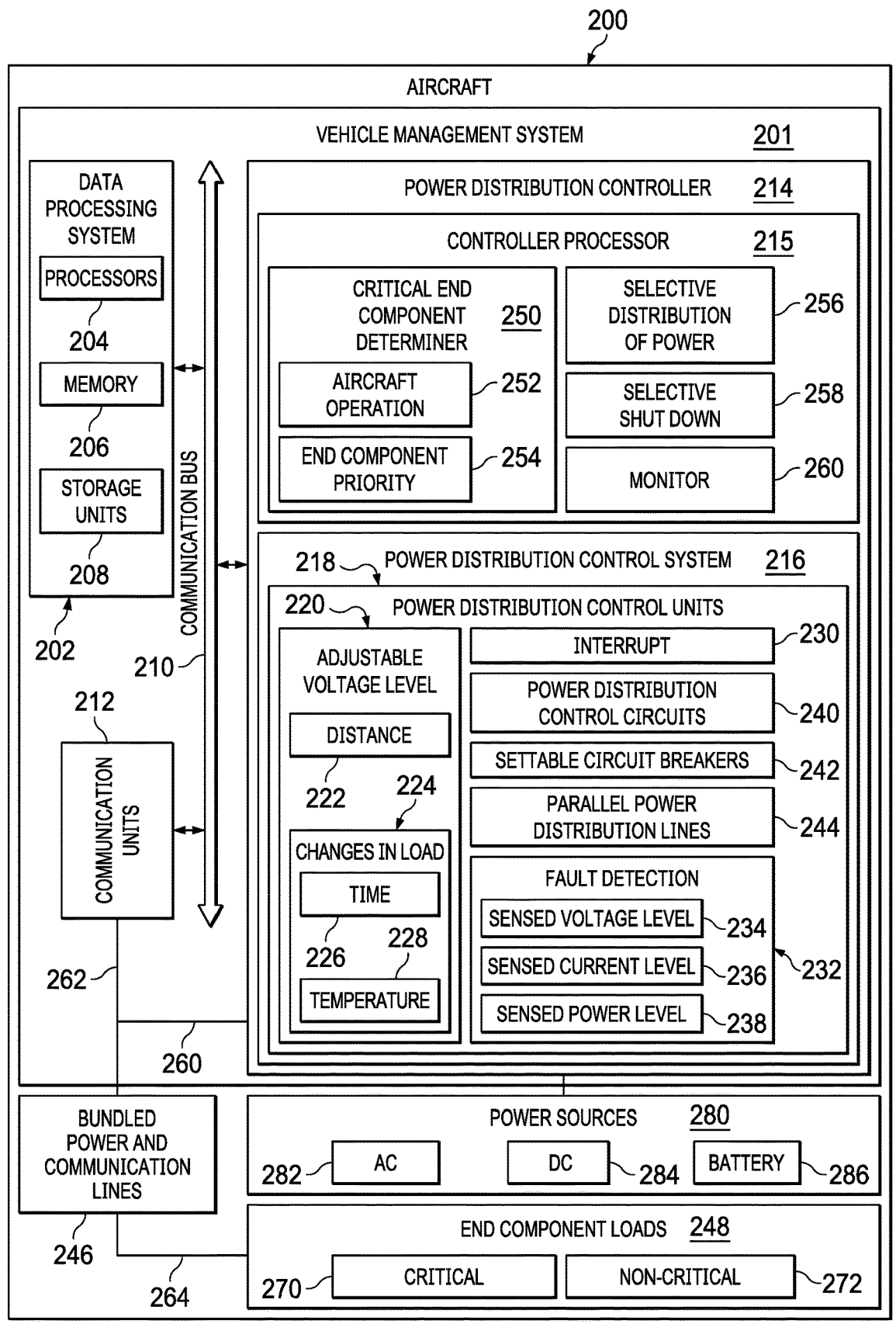
FIG. 2 is an illustration of an aircraft and its power distribution system in accordance with an illustrative embodiment.

Turning now to FIG. 2, an illustration of an aircraft and its power distribution system is depicted in accordance with an illustrative embodiment. Aircraft 200 is an example of an aircraft that may be implemented as aircraft 100 depicted in FIG. 1. Aircraft 200 includes vehicle management system (VMS) 201, a number of power sources 280, a number of end component loads 248, and a number of bundled power and communication lines 246. In an embodiment, the power distribution lines are separate from the communication lines. In an alternate embodiment, the power distribution is supplied over the communication lines such as via power over Ethernet. The number of power sources 280 may include a number of alternating current (AC) power sources 282, a number of direct current (DC) power sources 284, and a number of batteries 286. A bundled cable is a compilation of numerous wires that are harnessed or lashed together to provide an easier and quicker installation. Bundled cable provides several advantages over trying to pull single loose wires and cables. For example, by binding the many wires and cables into a bundled cable harness, the wires and cables can be better secured against the adverse effects of vibrations, abrasions, moisture, and will extend the life of the cable. Furthermore, by combining the wires into a bundle, usage of space is optimized, and the risk of shorting out is decreased substantially. Since the installer has only a single pull of cable to install (as opposed to multiple wires), installation time is decreased dramatically.

The number of end component loads 248 may include flight deck instruments, breaking system components, motors to move the flaps on the wings, motors to extend and retract landing gear, as well as other components on aircraft 200 that require electrical power to function. End component loads 248 include critical end components 270 and non-critical end components 272. Critical end components 270 may be any component that is necessary for the safe operation of aircraft 200 at a given time. The identification of end component loads 248 as critical end component 270 or non-critical end component 272 may vary with time and the particular operation of aircraft 200. For example, one of end component loads 248 may be considered critical end component 270 during take-off, but may be considered non-critical component 272 during level flight.

VMS 201 includes data processing system 202, a number of communication units 212, power distribution controller 214, and communication bus 210 communicatively connecting data processing system 202, the number of communication units 212, and power distribution controller 214. Data processing system 202 includes a number of processors 204, memory 206, and a number of storage units 208. By integrating power distribution controller 214 with data processing system 202 within the VMS 201 via communication bus 210, time-sensitive determinations regarding readjusting power distribution can be made more quickly than in prior art systems that lack integration of power distribution controller 214 with VMS 201.

Power distribution controller 214 includes power distribution control system 216, critical end component determiner 250, and monitor 260. Power distribution control system 216 includes a number of power distribution control units 218. Each of power distribution control units 218 includes power distribution control circuit 240, settable circuit breakers 242, and parallel power distribution lines 244. Power distribution control units 218 are controlled by power distribution controller 214.

Power distribution control circuits 240 are each controlled by power distribution controller 214 to supply power to end component loads 248. Power distribution controller 214 is communicably coupled to data processing system 202 by communication bus 210. Communication bus 210 also coupled communication units 212 to power distribution controller 214 and to data processing system 202. Power distribution controller 214 may also include controller processor 215 to perform power distribution control functions such as selective distribution of power 256, selective shut down 258, and monitor 260 that monitors end component loads 248. Controller processor 215 may also include critical end component determiner 250 to determine, for example, aircraft operation 252 and end component priority 254.

Power distribution controller 214 is configured to control power generation by each of a plurality of power distribution control circuits 240 such that each of the plurality of power distribution control circuits 240 generates output power at adjustable voltage level 220 to a respective one of end component loads 248. In an embodiment, each one of adjustable voltage level 220 is adjusted based on at least one of distance 222 to the respective one of end component loads 248, changes in load 224 of the respective one of end component loads 248 over time 226, and changes in load 224 of the respective one of end component loads 248 due to a variation of temperature 228 in the respective one of end component loads 248. Power distribution controller 214 is also configured to interrupt 230 operation of an individual one of power distribution circuits 240 upon detecting a fault. The fault is determined, for example, according to at least one of sensed voltage level 234, sensed current level 236, and sensed power level 238.

Power distribution controller 214 is also configured to shut down the individual one of power distribution circuits 240 without interrupting remaining ones of the plurality of power distribution circuits 240 when, for example, a fault is detected on one of power distribution control circuits 240. By having control of as to when different parts of the system come online, a particular one of end component loads 248 can start operating immediately upon power up. End component loads 248 do not have to check if other parts of aircraft 200 are on before powering up because power distribution controller 214 will bring other ones of end component loads 248 online in proper order. Thus, by eliminating the checks of other system's statuses within aircraft 200, startup time can be improved. Furthermore, power distribution controller 214 is also configured for selective distribution power 256 such that critical end component load 270 is maintained at full power and power to non-critical end component load 272 is reduced when total power is insufficient to fully power all of end component loads 248 simultaneously. Critical end component load 270 is dynamically determined by critical end component determiner 250 according to, for example, a current aircraft operation 252 and end component priority 254. End component loads 248 that are critical depends on the type of aircraft operation 252. For example, end component loads 248 that are critical 270 during take-off may be different from those that are critical 270 during landing and both of which may be different from those that are critical 270 during level flight. End component priority 254 may be determined based on aircraft operation 252. Thus, if there is insufficient power to power all end component loads 248 fully, priority is given to the most critical 270 one of end component loads 248 to ensure that at least these end component loads 248 are fully powered. This allows for a hierarchical prioritization of the various end components to ensure that the most important end components receive full power while other less important components may receive less than full power or no power at all if there is insufficient power to power all end components.

Each of power distribution control units 218 corresponds to a respective one of end component loads 248 to supply power to a corresponding one of end component loads 248 through parallel power distribution lines 244. Each of parallel power distribution lines 244 supplies power to the end components such that if power through one of parallel power distribution lines 244 is lost, the other one of parallel power distribution lines 244 will provide full power to the corresponding one of end component loads 248. Unless, power is lost on one line, each of parallel power distribution lines 244 provides only a portion of the power to the respective one of end component loads 248. Providing power in this manner extends the life of parallel power distribution lines 244.

Power distribution controller 214 includes a plurality of settable circuit breakers 242 such that each of the plurality of settable circuit breakers 242 corresponds to a respective one of the plurality of power distribution control circuits 240 within a respective one of power distribution control units 218. Power distribution controller 214 is configured to monitor 260 sensed voltage, sensed current levels, spikes in the internal power distribution circuits 240, and interruptions in the internal power distribution circuits 240. Power distribution controller 214 is also configured to interrupt 230 a respective one of the plurality of power distribution control circuits 240 via settable circuit breaker 242 upon fault detection 232 detecting at least one of sensed voltage level 234 indicative of a fault, sensed current level 236 indicative of a fault, and sensed power level 238 indicative of a fault. Each of settable circuit breakers 242 includes a respective settable circuit breaker range, wherein each of the respective settable circuit breaker ranges is adjusted to interrupt 230 operation of an individual one of power distribution control circuits 240 based on at least one of a plurality of conditions in addition to the sensed voltage, current, and power levels. The plurality of conditions include, for example, at least one of a run (i.e., power connection) to the respective end component load, distance 222 to the respective one of end component loads 248, a change in load of the respective one of end component loads 248 over time 226, and a change in the load of the respective one of end component loads 248 due to variation in temperature 228. The selectable circuit breaker range for each of settable circuit breakers 242 is dynamically determined and may be different for different ones of end component loads 248. The selectable circuit breaker range may be determined according to aircraft operation 252 and/or end component priority 254. Thus, the level at which settable circuit breakers 242 interrupt power for a given one of end component loads 248 may vary over time depending on a current operation of the aircraft (e.g., take-off, landing, level flight, etc.) and/or end component priority 254 to ensure that the critical end components are properly powered.

Parallel power distribution lines 244 from each of power distribution control units 218 is bundled 246 with respective ones of communication lines 262 from communication units 212 to provided bundled power and communication lines 264 to end component loads 248. Each one of end component loads 248 corresponds to a separate one of power distribution control units 218 and communication units 212 such that each end component load has its own bundled power and communication lines 264. In an embodiment, parallel power distribution lines 244 are pairs of parallel power distribution lines.

Figure 3:
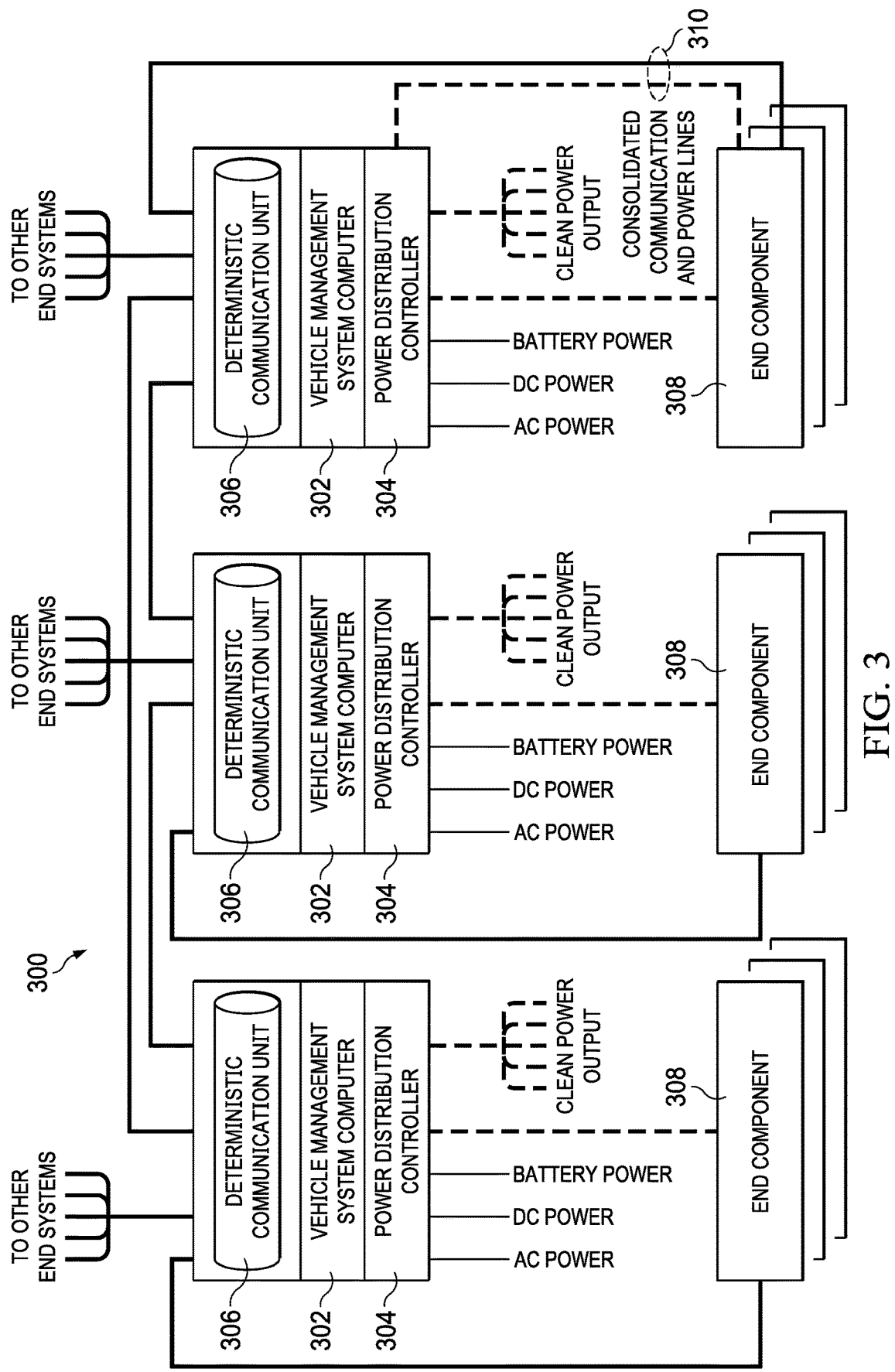
FIG. 3 is an illustration of a vehicle electric power distribution system in accordance with an illustrative embodiment.

Turning now to FIG. 3, an illustration of a vehicle electric power distribution system is depicted in accordance with an illustrative embodiment. System 300 is an example of a VMS that can be implemented in an aircraft such as aircraft 200 depicted in FIG. 2. System 300 includes a plurality of vehicle management system (VMS) computers 302 and a plurality of end components 308. Each VMS computer includes an integrated power distribution controller 304 and an integrated deterministic communication unit 306. Both of power distribution controller 304 and deterministic communication unit 306 are coupled to VMS computer 302 by a bus. VMS computer 302 may be implemented as data processing system 202 in FIG. 2; power distribution controller 304 may be implemented as power distribution controller 214 in FIG. 2; and deterministic communication unit 306 may be implemented as one of communication units 212 in FIG. 2.

Each deterministic communication unit 306 communicates with a respective one of end components 308 as well as other end systems. Each power distribution controller 304 receives AC power, DC power, and battery power from one or more power sources and provides a clean power output to a respective one of end components 308. The power distribution lines from power distribution controller 304 are bundled with the communication lines from deterministic communication units 306 to form consolidated communication and power lines 310. This simplifies wiring since a single bundled or consolidated cable carrying all the communication and power lines is provided thereby requiring a single line pull for each end component 308 during aircraft assembly. This single line pull also speeds up wiring during aircraft assembly. Additionally, consolidated communication power lines 310, such as a single consolidated cable, reduces overall weight in the aircraft and reduces the volume occupied by the wiring. Power distribution controller 304 provides power to a corresponding one of end components 308 in a form suitable for the corresponding one of end component 308 (i.e., in an AC format or a DC format). Power distribution controller 304 may use battery power to supply power to some end components. Additionally, some end components may normally use another power source other than battery power, but can be powered by the battery when the normal power source fails.

Figure 4:
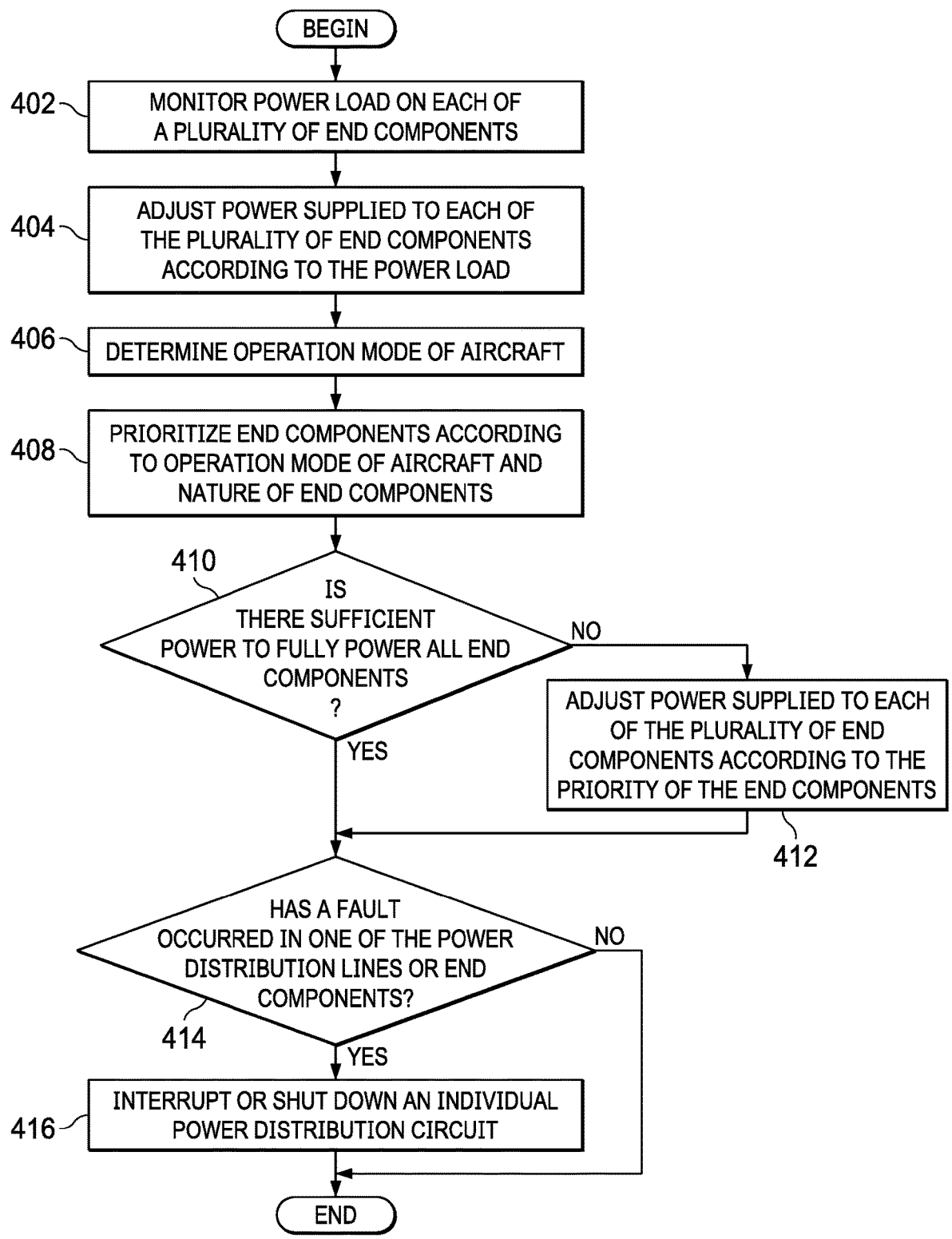
FIG. 4 is a flowchart of a method for selectively supplying electrical power to a plurality of end component loads in accordance with an illustrative embodiment.

Turning now to FIG. 4, a flowchart of a method for selectively supplying electrical power to a plurality of end component loads is depicted in accordance with an illustrative embodiment. Method 400 may be implemented in, for example, vehicle management system 201 depicted in FIG. 2. In an embodiment, method 400 is implemented in power distribution controller 214 depicted in FIG. 2. Method 400 begins by monitoring a power load on each of a plurality of end components (step 402). Next, power supplied to each of the plurality of end components is adjusted according to the power load (step 404). Next, operation mode (e.g., take-off, landing, level flight, etc.) of an aircraft is determined (step 406). Next, the end components are prioritized according to the operation mode of the aircraft and according to the nature of the end component (e.g., the function provided by the end component) (step 408). Next, it is determined whether there is sufficient power to fully power all end components (step 410). If, at step 410, it is determined that insufficient power exists to fully power all end components, then method 400 proceeds to step 412 where the power supplied to each of the plurality of end components is adjusted according to the priority of the end components to ensure that the most critical end components receive full power. If, sufficient power exists to fully power all end components, then method 400 proceeds to step 414 where it is determined whether a fault has occurred in one of the power distribution lines or end components. If no fault has occurred, method 400 may end. If a fault has occurred, method 400 proceeds to step 416 where the power to the individual power distribution circuit corresponding to where the fault occurred is interrupted or shut down, after which, method 400 may end.

Figures 5, 6:
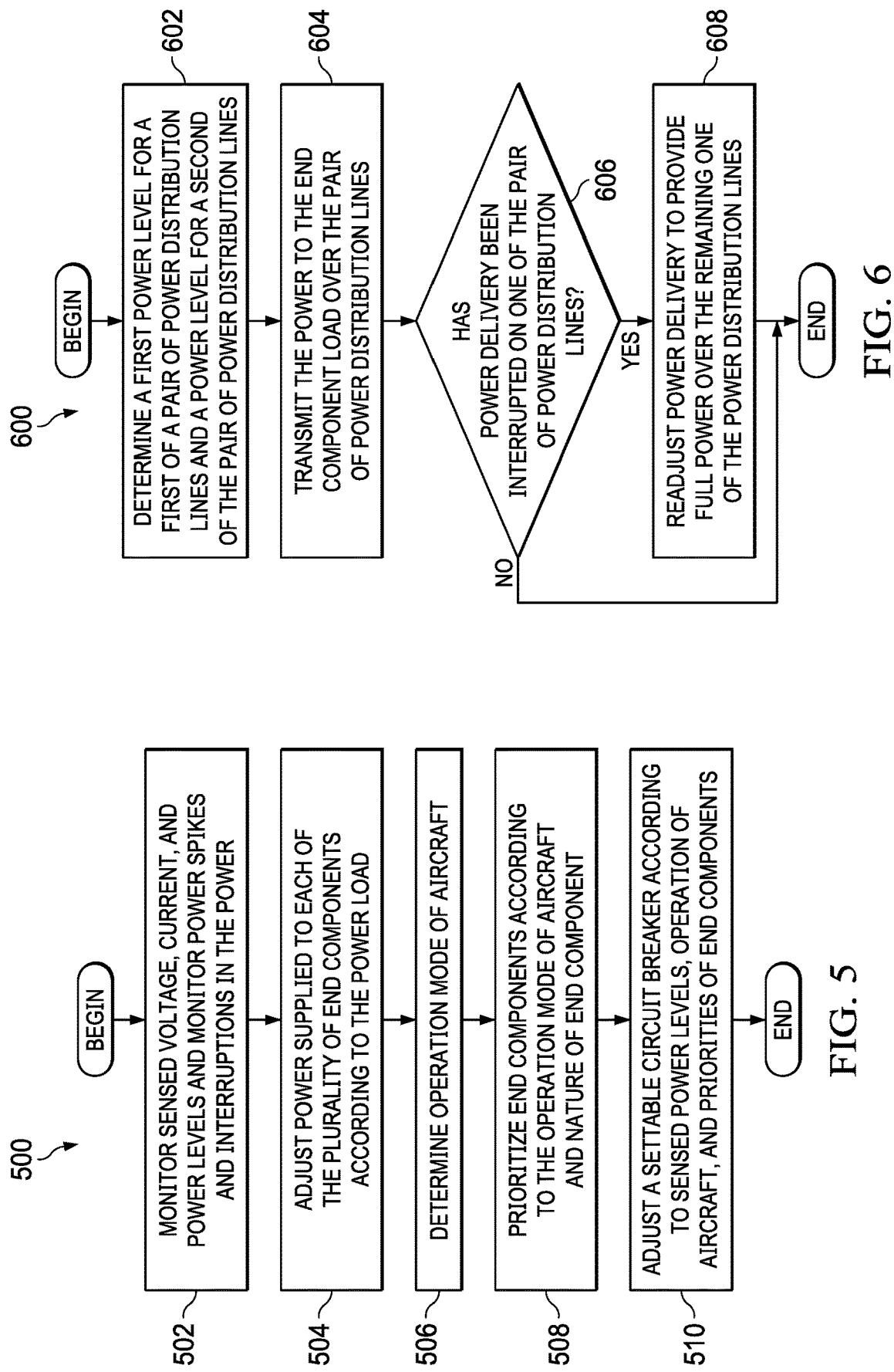
FIG. 5 is a flowchart of a method for adjusting a settable circuit breaker in accordance with an illustrative embodiment.
FIG. 6 is a flowchart of a method for providing power to an end component load through a pair of power distribution lines in accordance with an illustrative embodiment.

Turning now to FIG. 5, a flowchart of a method for adjusting a settable circuit breaker is depicted in accordance with an illustrative embodiment. Method 500 begins by monitoring a sensed voltage level, a sensed current level, a sensed power level, power spikes, and power interruptions in each of power supplies for each of end components (step 502). Next, the power supplied to each of the plurality of end components is adjusted according to the power load (step 504). Next, an operation mode of the aircraft is determined (step 506), and then the end components are prioritized according to the operation mode and the nature of each individual end component (step 508). Next, a settable circuit breaker is adjusted dynamically according to the sensed power voltage levels, sensed current levels, sensed power levels, power spikes, power interruptions, the operation mode of the aircraft, and the priorities of the end components (step 510). Adjusting the settable circuit breakers allows the system to prevent or mitigate damage to a component based on the current power conditions as well as ensure that high priority end components remain functional. Afterwards, method 500 terminates.

Turning now to FIG. 6, a flowchart of a method for providing power to an end component load through a pair of power distribution lines is depicted in accordance with an illustrative embodiment. Method 600 begins by determining a first power level for a first of a pair of power distribution lines and a power level for a second of the pair of power distribution lines (step 602). Next, the power is transmitted to the end component load over the pair of power distribution lines (step 604). Next, it is determined whether power delivery has been interrupted in one of the pair of power distribution lines (step 606). If not, then method 600 may end. If power has been interrupted in one of the pair of power distribution lines, then the power delivery is readjusted to provide full power to the end component over the remaining one of the pair of power distribution lines (step 608), after which, method 600 may end.

Figure 7:
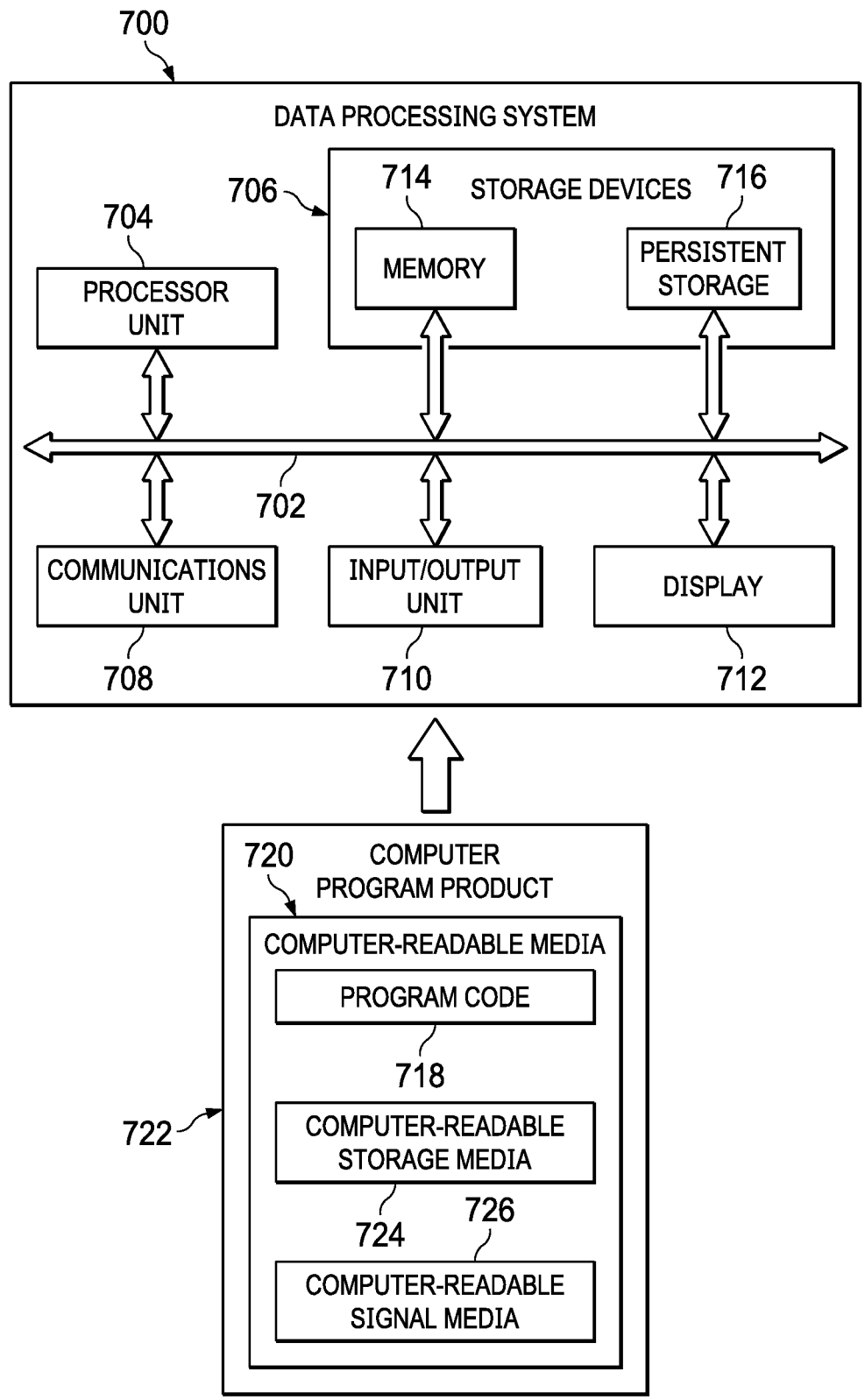
FIG. 7 is an illustration of a block diagram of a data processing system in accordance with an illustrative embodiment.

Turning now to FIG. 7, an illustration of a block diagram of a data processing system is depicted in accordance with an illustrative embodiment. Data processing system 700 may be used to implement VMS 201, data processing system 202, and/or power distribution controller 214 depicted in FIG. 2. Data processing system 700 may also be used to implement VMS computer 302 and/or power distribution controller 304 depicted in FIG. 3. As depicted, data processing system 700 includes communications framework 702, which provides communications between processor unit 704, storage devices 706, communications unit 708, input/output unit 710, and display 712. In some cases, communications framework 702 may be implemented as a bus system.

Processor unit 704 is configured to execute instructions for software to perform a number of operations. Processor unit 704 may comprise a number of processors, a multiprocessor core, and/or some other type of processor, depending on the implementation. In some cases, processor unit 704 may take the form of a hardware unit, such as a circuit system, an application specific integrated circuit (ASIC), a programmable logic device, or some other suitable type of hardware unit.

Instructions for the operating system, applications, and/or programs run by processor unit 704 may be located in storage devices 706. Storage devices 706 may be in communication with processor unit 704 through communications framework 702. As used herein, a storage device, also referred to as a computer-readable storage device, is any piece of hardware capable of storing information on a temporary and/or permanent basis. This information may include, but is not limited to, data, program code, and/or other information.

Memory 714 and persistent storage 716 are examples of storage devices 706. Memory 714 may take the form of, for example, a random access memory or some type of volatile or non-volatile storage device. Persistent storage 716 may comprise any number of components or devices. For example, persistent storage 716 may comprise a hard drive, a flash memory, a rewritable optical disk, a rewritable magnetic tape, or some combination of the above. The media used by persistent storage 716 may or may not be removable.

Communications unit 708 allows data processing system 700 to communicate with other data processing systems and/or devices. Communications unit 708 may provide communications using physical and/or wireless communications links.

Input/output unit 710 allows input to be received from and output to be sent to other devices connected to data processing system 700. For example, input/output unit 710 may allow user input to be received through a keyboard, a mouse, and/or some other type of input device. As another example, input/output unit 710 may allow output to be sent to a printer connected to data processing system 700.

Display 712 is configured to display information to a user. Display 712 may comprise, for example, without limitation, a monitor, a touch screen, a laser display, a holographic display, a virtual display device, and/or some other type of display device.

In this illustrative example, the processes of the different illustrative embodiments may be performed by processor unit 704 using computer-implemented instructions. These instructions may be referred to as program code, computer usable program code, or computer-readable program code and may be read and executed by one or more processors in processor unit 704.

In these examples, program code 718 is located in a functional form on computer-readable media 720, which is selectively removable, and may be loaded onto or transferred to data processing system 700 for execution by processor unit 704. Program code 718 and computer-readable media 720 together form computer program product 722. In this illustrative example, computer-readable media 720 may be computer-readable storage media 724 or computer-readable signal media 726.

Computer-readable storage media 724 is a physical or tangible storage device used to store program code 718, rather than a medium that propagates or transmits program code 718. Computer-readable storage media 724 may be, for example, without limitation, an optical or magnetic disk or a persistent storage device that is connected to data processing system 700.

Alternatively, program code 718 may be transferred to data processing system 700 using computer-readable signal media 726. Computer-readable signal media 726 may be, for example, a propagated data signal containing program code 718. This data signal may be an electromagnetic signal, an optical signal, and/or some other type of signal that can be transmitted over physical and/or wireless communications links.

Figure 8:
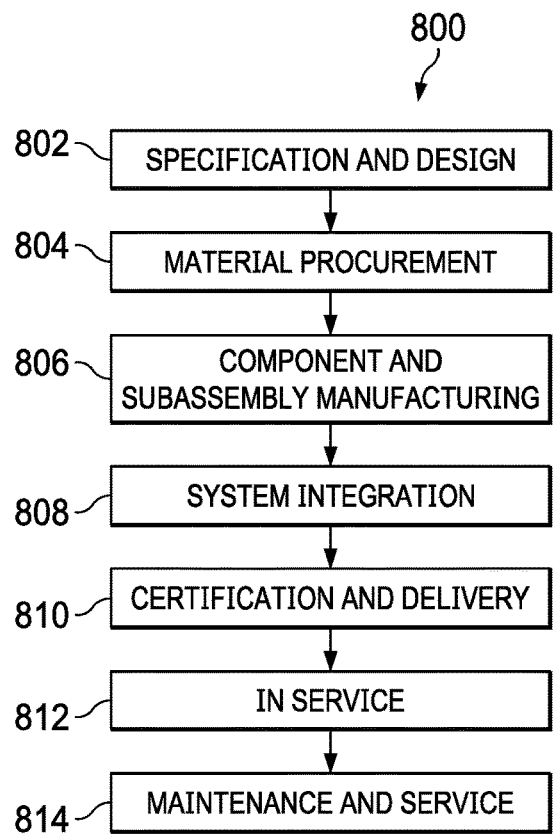
FIG. 8 is an illustration of an aircraft manufacturing and service method in the form of a block diagram in accordance with an illustrative embodiment.
Figure 9:
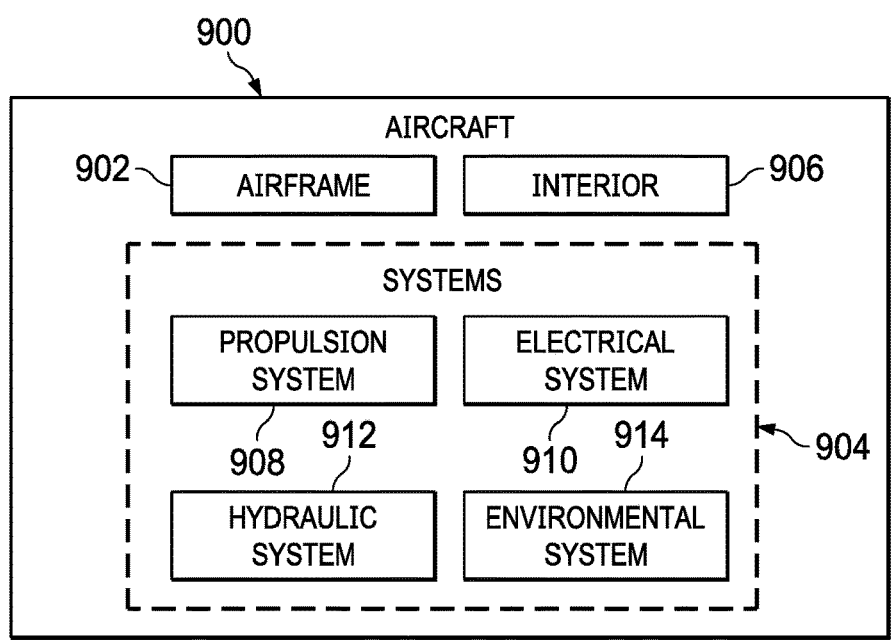
FIG. 9 is an illustration of an aircraft in the form of a block diagram in which an illustrative embodiment may be implemented.

Illustrative embodiments of the present disclosure may be described in the context of aircraft manufacturing and service method 800 as shown in FIG. 8 and aircraft 900 as shown in FIG. 9. Turning first to FIG. 8, an illustration of an aircraft manufacturing and service method is depicted in accordance with an illustrative embodiment. During pre-production, aircraft manufacturing and service method 800 may include specification and design 802 of aircraft 900 in FIG. 9 and material procurement 804.

During production, component and subassembly manufacturing 806 and system integration 808 of aircraft 900 takes place. Thereafter, aircraft 900 may go through certification and delivery 810 in order to be placed in service 812. While in service 812 by a customer, aircraft 900 is scheduled for routine maintenance and service 814, which may include modification, reconfiguration, refurbishment, and other maintenance or service.

Each of the processes of aircraft manufacturing and service method 800 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 9, an illustration of an aircraft is depicted in which an illustrative embodiment may be implemented. In this example, aircraft 900 is produced by aircraft manufacturing and service method 800 in FIG. 8 and may include airframe 902 with plurality of systems 904 and interior 906. Examples of systems 904 include one or more of propulsion system 908, electrical system 910, hydraulic system 912, and environmental system 914. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 800. One or more illustrative embodiments may be used during component and subassembly manufacturing 806 of FIG. 8. For example, the power distribution controller 214 may be installed in the aircraft 100 during the aircraft manufacturing and service method 800.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A vehicle management system computer, comprising:
   a data processing system comprising a processor and a memory;
   a power distribution controller comprising a plurality of power distribution circuits that are each controlled by the power distribution controller to supply power to end component loads, the power distribution controller communicably coupled to the data processing system by a bus; and
   a plurality of settable circuit breakers, wherein each of the plurality of settable circuit breakers corresponds to a respective one of the plurality of power distribution circuits;
   wherein the power distribution controller is configured to monitor sensed voltage, sensed current levels, spikes in the power distribution circuits, and interruptions in the power distribution circuits;
   wherein the power distribution controller is further configured to interrupt a respective one of the plurality of power distribution circuits via a settable circuit breaker upon detecting at least one of a sensed voltage level indicative of a fault, a sensed current level indicative of a fault, and a power level indicative of a fault;

wherein the power distribution controller is further configured to selectively distribute the power such that a critical end component load is maintained at full power and the power to a non-critical end component load is reduced when total power is insufficient to operate all of the end component loads simultaneously; and wherein the power distribution controller is further configured to dynamically determine the critical end component load according to a current vehicle operation and an end component priority.

2. The vehicle management system computer of claim 1, wherein each settable circuit breaker of the plurality of settable circuit breakers comprises a respective settable circuit breaker range, wherein each of the respective settable circuit breaker ranges is adjusted to interrupt operation of an individual power distribution circuit based on at least one of a plurality of conditions.

3. The vehicle management system computer of claim 2, wherein the plurality of conditions comprise at least one of a run to a respective end component load, a distance to the respective end component load, a change in load of the respective end component load over time, and a change in the load of the respective end component load due to variation in temperature.

4. The vehicle management system computer of claim 2, wherein the respective settable circuit breaker range is dynamically determined.

5. The vehicle management system computer of claim 2, wherein at least two of the respective settable circuit breaker ranges are different.

6. The vehicle management system computer of claim 5, wherein the respective settable circuit breaker range is dynamically determined according to vehicle operation.

7. The vehicle management system computer of claim 5, wherein the respective settable circuit breaker range is dynamically determined according to the end component priority.

8. A method for selectively powering a plurality of end components in a vehicle, the method comprising:
monitoring each of a plurality of end component loads for a fault condition;
selectively interrupting power to a one of the plurality of end component loads with a settable circuit breaker in response to a determination that a fault occurred in the one of the plurality of end component loads, wherein a selected power to each of remaining ones of the plurality of end component loads remains unaffected by the interruption of power to the one of the plurality of end component loads;
selectively distributing the power such that a critical end component load is maintained at full power and the power to a non-critical end component load is reduced when total power is insufficient to operate all of the plurality of end component loads simultaneously; and
dynamically determining the critical end component load according to a current vehicle operation and an end component priority.

9. The method of claim 8, wherein selectively interrupting the power to the one of the plurality of end component loads comprises interrupting the power to the one of the plurality of end component loads upon detecting at least one of a sensed voltage level indicative of a fault, a sensed current level indicative of a fault, and a power level indicative of a fault.

10. The method of claim 8, wherein selectively interrupting the power to the one of the plurality of end component loads comprises interrupting the power to the one of the plurality of end component loads upon detecting one of a plurality of conditions, wherein the plurality of conditions comprise at least one of a run to a respective end component load, a distance to the respective end component load, a change in load of the respective end component load over time, and a change in the load of the respective end component load due to variation in temperature.

11. The method of claim 8, wherein selectively interrupting the power comprises setting a settable circuit breaker range for each of the plurality of end component loads, and wherein at least two of the settable circuit breaker ranges are different.

12. The method of claim 11, wherein the settable circuit breaker range is dynamically determined.

13. The method of claim 11, wherein the settable circuit breaker range is dynamically determined according to operation of the vehicle.

14. The method of claim 11, wherein the settable circuit breaker range is dynamically determined according to the end component priority.

15. A vehicle management system for selectively interrupting power to an end component in a vehicle, comprising:
a processor; and
a non-transitory computer readable medium storing program code which, when executed by the processor, performs a computer-implemented method selective power interruption, the program code comprising:
program code for monitoring each of a plurality of end component loads for a fault condition;
program code for selectively interrupting power to a one of the plurality of end component loads with a settable circuit breaker in response to a determination that a fault occurred in the one of the plurality of end component loads, wherein a selected power to each of remaining ones of the plurality of end component loads remains unaffected by the interruption of power to the one of the plurality of end component loads;
program code for selectively distributing the power such that a critical end component load is maintained at full power and the power to a non-critical end component load is reduced when total power is insufficient to operate all of the plurality of end component loads simultaneously; and
program code for dynamically determining the critical end component load according to a current vehicle operation and an end component priority.

16. The vehicle management system of claim 15, wherein the program code for selectively interrupting the power to the one of the plurality of end component loads comprises program code for interrupting the power to the one of the plurality of end component loads upon detecting at least one of a sensed voltage level indicative of a fault, a sensed current level indicative of a fault, and a power level indicative of a fault.

17. The vehicle management system of claim 15, wherein the program code for selectively interrupting the power to the one of the plurality of end component loads comprises program coded for interrupting the power to the one of the plurality of end component loads upon detecting one of a plurality of conditions, wherein the plurality of conditions comprise at least one of a run to a respective end component load, a distance to the respective end component load, a change in load of the respective end component load over time, and a change in the load of the respective end component load due to variation in temperature.

18. The vehicle management system of claim 15, wherein the program code for selectively interrupting the power comprises program code for setting a settable circuit breaker range for each of the plurality of end component loads, and wherein at least two of the settable circuit breaker ranges are different.

19. The vehicle management system of claim 18, wherein the settable circuit breaker range is dynamically determined according to operation of the vehicle.

20. The vehicle management system of claim 18, wherein the settable circuit breaker range is dynamically determined according to the end component priority.

\* \* \* \* \*